United States Patent
Cheng et al.

(10) Patent No.: US 6,759,347 B1
(45) Date of Patent: Jul. 6, 2004

(54) METHOD OF FORMING IN-SITU SRO HDP-CVD BARRIER FILM

(75) Inventors: Yi-Lung Cheng, Taipei (TW); Ming-Hwa Yoo, Yung hu (TW); Sze-An Wu, Hsin-Chu (TW); Ying Lung Wang, Ya-Chung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/401,715

(22) Filed: Mar. 27, 2003

(51) Int. Cl.[7] .................. H01L 21/31; H01L 21/469
(52) U.S. Cl. ............... 438/778; 118/723; 257/760; 438/783; 438/787; 438/788
(58) Field of Search ............... 118/697, 723; 257/760; 438/424, 681, 778, 783, 787–790

(56) References Cited

U.S. PATENT DOCUMENTS 6,335,274 B1 * 1/2002 Wu et al. .................. 438/626
6,380,066 B1 * 4/2002 See et al. .................. 438/624
6,528,886 B2 * 3/2003 Liu et al. .................. 257/760

* cited by examiner

Primary Examiner—Kamand Cuneo
Assistant Examiner—Asok Kumar Sarkar
(74) Attorney, Agent, or Firm—Tung & Associates

(57) ABSTRACT

A method of reducing plasma induced damage in semiconductor devices and fluorine damage to a metal containing layer including providing a semiconductor wafer including semiconductor devices including a gate oxide and a process surface including metal lines; carrying out a first high density plasma chemical vapor deposition (HDP-CVD) process to controllably produce a silicon rich oxide (SRO) layer including a relatively increased thickness at a center portion of the process surface compared to a peripheral portion of the process surface; and, carrying out a second HDP-CVD process in-situ to deposit a fluorine doped silicon dioxide layer over the SRO layer to fill a space between the metal lines.

21 Claims, 2 Drawing Sheets

US 6,759,347 B1

METHOD OF FORMING IN-SITU SRO HDP-CVD BARRIER FILM

FIELD OF THE INVENTION

This invention generally relates to HDP-CVD deposition processes and more particularly to a method for forming a silicon-rich oxide (SRO) barrier film in-situ prior to forming a fluorosilicate glass (FSG) layer to avoid fluorine and plasma induced defects to a metallization layer.

BACKGROUND OF THE INVENTION

As devices become smaller and integration density increases, the high density plasma chemical vapor deposition (HDP-CVD) process has become, a key process due to its gap-filling capability. In particular, high density plasma (HDP) processes, such as electron cyclotron resonance (ECR) processes and induced coupling plasma (ICP) processes have been found to produce high-quality silicon dioxide and silicon nitride layers. Generally, HDP-CVD provides a high density of low energy ions resulting in higher quality films at lower deposition temperatures, compared to for example, PECVD. HDP-CVD is particularly ideal for forming interlayer dielectric (ILD) oxide layers because of its superior gap filling capability. Generally, both sputtering and deposition take place simultaneously, resulting in a deposition/sputter ratio (D/S/) ratio that may be adjusted according to process parameters. In an HDP-CVD deposition process, for example, a bias power is coupled to the semiconductor wafer to attract ions which sputter (etch) the wafer during deposition (re-sputtering effect), thereby preventing a phenomena known as crowning where the deposition material converges over the trench before an etched feature opening is completely filled with the deposition material. The deposition rate may therefore be more finely tuned to improved CVD deposition properties to, for example, avoid crowning.

The D/S (deposition-sputtering rate ratio) is a commonly used measure of the gap-filling capability of the process. Among the disadvantages of a lower D/S ratio include the possibility of "corner clipping," or "edge erosion" along the edges of metal lines and the lowering of processing throughput since it requires a relatively longer period of time to achieve the formation of the HDP-CVD oxide. The high density of the plasma can result in significant heating of the wafer during deposition requiring a cooled wafer chuck to cool the wafer during deposition. Generally, higher sputtering rates (lower D/S ratios) tend to increase the temperature of the wafer substrate and as such high temperatures have been necessary at the early stages of gap filling when low deposition/sputter ratios (typically less than 4) are necessary to fill the high aspect ratio channels. Temperatures as high as 400° C. have been observed and at these temperatures significant distortion of the metal features and circuitry have been observed.

On the other hand, a relatively higher D/S ratio results in problems with gap-filling ability leading to the formation of voids. Consequently, many HDP processes according to the prior art to have tended to optimize the HDP-CVD process whereby the D/S ratio is carried out at lower levels in a one step process in order to maximize gap-filling ability.

One type of IMD layer dielectric that has found increasing use is fluorosilicate glass (FSG) also referred to as silicon oxyfluoride. FSG tends to reduce the dielectric constant of IMD layers to levels around 3.5, which in many applications is sufficient to reduce the capacitance of the dielectric layer to desired levels thereby decreasing a signal time constant (RC time constant) which can adversely signal transmission.

One problem with using PSG as a gap filling dielectric layer is that fluorine tends to diffuse through the FSG and attacks the metal lines, for example aluminum, causing a bubble like defect on the aluminum. Although the deposition of barrier layers has been proposed in the prior art, prior art barrier layers have suffered from a lack of presenting a sufficient barrier to fluorine diffusion and achieving sufficient film thickness uniformity, which has tended to result in plasma induced damage at thinner portions of a barrier layer during the HDP-CVD process to deposit the FSG.

There is therefore a need in the semiconductor processing art to develop an improved method for depositing HDP-CVD FSG such that fluorine attack of underlying metallization layers is reduced or avoided and HDP-CVD plasma damage to the wafer process surface is avoided in the HDP-CVD FSG deposition process.

It is therefore an object of the invention to provide develop an improved method for depositing HDP-CVD FSG such that fluorine attack of underlying metallization layers is reduced or avoided and HDP-CVD plasma damage to the wafer process surface is avoided in the HDP-CVD FSG deposition process while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method of reducing plasma induced damage in semiconductor devices and fluorine damage to a metal containing layer.

In a first embodiment, the method includes providing a semiconductor wafer including semiconductor devices including a gate oxide and a process surface including metal lines; carrying out a first high density plasma chemical vapor deposition (HDP-CVD) process to controllably produce a silicon rich oxide (SRO) layer including a relatively increased thickness at a center portion of the process surface compared to a peripheral portion of the process surface; and, carrying out a second HDP-CVD process in-situ to deposit a fluorine doped silicon dioxide layer over the SRO layer to fill a space between the metal lines.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with exemplary implementation to the formation of a gap filling of metal lines by an fluorosilicate glass (FSG) IMD layer, it will be appreciated that the method of the present invention in forming an in-situ HDP-CVD silicon rich oxide (SRO) barrier layer prior to or following formation of an HDP-FSG layer may advantageously be used in any semiconductor manufacture process, including copper damascene formation, whereby an increased resistance to fluorine diffusion and reduced plasma damage to a wafer process surface would be advantageously achieved while improving a wafer throughput.

Figure 1A:
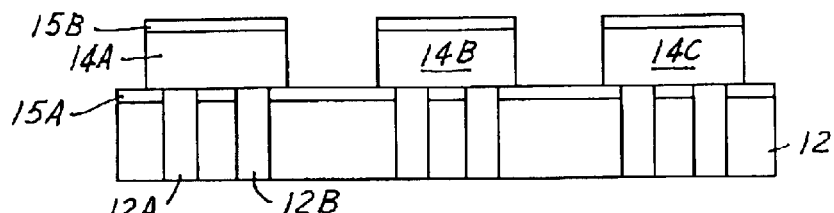
FIGS. 1A–1C is a cross sectional side view of a portion of a semiconductor device at stages in manufacture according to an embodiment of the present invention.

Referring to FIG. 1A, a cross sectional side view of a portion of an exemplary multi-level semiconductor device is shown. Metal lines, e.g., 14A, 14B and 14C are shown formed over an insulating dielectric layer e.g., 12 and over metal filled damascene plugs, e.g., 12A and 12B, for example tungsten filled plugs formed by methods known in the art. In forming the metal lines e.g., 14A, 14B and 14C, in an exemplary process a refractory metal barrier layer 15A, such as titanium is deposited over the tungsten plugs followed by deposition, for example PVD of an aluminum-copper alloy layer, for example 99 wt % aluminum and 1 wt % copper. An anti-reflectance coating (ARC) layer, for example a refractory metal nitride layer 15B such as TiN is deposited over the aluminum alloy layer prior to a photolithographic patterning process to pattern and anisotropically etch the metal lines e.g., 14A and 14B. Metal line widths are preferably less than about 0.25 micron. The height of the lines can be between about 0.3 microns and 1.2 microns. The aspect ratio of the metal lines is typically greater than about 2. The metal lines may be made of aluminum, aluminum-copper alloys, copper and tungsten, but are preferably aluminum-copper alloys.

Figure 1B:
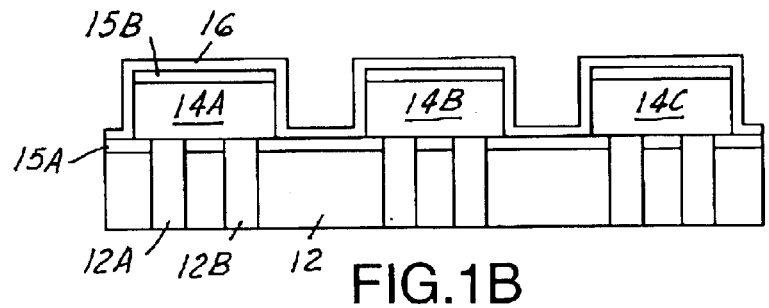

Referring to FIG. 1B, according to an embodiment of the invention, a silicon rich oxide (SRO) layer 16 is then blanket deposited in-situ in an HDP-CVD reactor over the metal lines, preferably using an electrodeless excitation of the plasma, preferably an inductively coupled plasma (ICP) also referred to as a transformer coupled plasma (TCP), or decoupled plasmas (DCP) RF power source. The formation of the SRO layer 16 in-situ in the HDP-CVD reactor in an HDP-CVD process is an important aspect of the present invention. Preferably, the SRO layer 16 is formed at a thickness of about 150 Angstroms to about 500 Angstroms having a thickness of the SRO layer at a center portion of the wafer thicker by at least about 10 Angstroms, preferably from about 10 Angstroms to about 100 Angstroms, compared to a peripheral portion. Preferably, the center portion of the wafer comprises from about one-fourth to about one-half the diameter of the process wafer diameter. It will be appreciated that the desired thickness of the SRO layer may change depending on the metal line size, for example desiring to leave enough room between metal lines for subsequent deposition of a desired thickness of FSG to reduce an inter-line capacitance. The SRO layer 16 is preferably formed by supplying plasma source gases to form a plasma including silane ($SiH_4$), an oxygen source such as $O_2$ or $O_3$, and a nitrogen source of at least one of $N_2$, $NH_3$, NO, or $N_2O$. As is known, a silicon rich oxide (SRO) film (sub-stoichiometric $SiO_2$ with an oxygen to silicon ration e.g., less than about 1.46) is formed by the high degree of incorporation of nitrogen and hydrogen into the silicon dioxide film resulting in a silicon rich oxide film.

Preferably, the HDP-CVD reactor is provided with means to adjust a flow rate of reactant gases over a central portion of the wafer, for example one or more adjustable reactant gas flow nozzles disposed over a central portion of the process wafer surface, to adjust a reactant gas source flow rate over selected portions of the wafer surface to form a relatively thicker SRO layer at a center portion according to preferred embodiments. For example, adjusting the angle and flow rate of gas reactant delivery to the process surface is suitably adjusted to form a relatively thicker SRO layer over a center portion of the wafer. For example, by increasing a gas flow rate of reactant gases over selected portions of the process wafer surface in a deposition process, for example over a center portion of a process wafer in depositing an SRO layer, a corresponding thickness increase over the center portion relative to the peripheral portion may be selectively achieved.

Figure 2A:
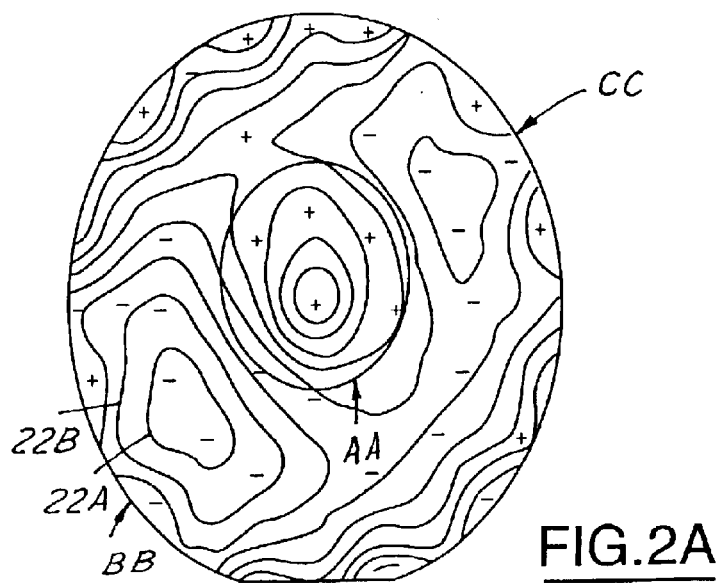
FIG. 2A is a top planar view of a wafer surface having an SRO layer according to an exemplary implementation of the present invention.

For example, referring to FIG. 2A is shown an exemplary top planar vies of an interferometer pattern of a wafer process surface obtained by conventional optical measurement method where the lines e.g., 22A and 22B represent lines of constant SRO thickness of an upper most SRO layer and the distance between lines e.g., 22A and 22B represent a thickness change. An area at the center portion of the wafer e.g., surrounded by circle AA is selectively formed in an HDP-CVD process to have a relatively thicker SRO layer compared to peripheral portions e.g., areas indicated at BB and CC.

For example, it has been found that with sub-quarter micron semiconductor devices where the gate oxide is from about 30 Angstroms to about 50 Angstroms that formation of an SRO layer by a plasma enhanced oxide (PEOX) for example, plasma enhanced chemical vapor deposition (PECVD) or plasma enhanced TEOS oxide was not sufficiently uniform to prevent plasma damage in a subsequent HDP-CVD oxide deposition, for example fluorosilicate glass (FSG). For example, it has been found that an SRO layer formed by a PECVD method resulted in a non-uniform thickness across the wafer surface in addition to consistently producing a thinner SRO layer over a center portion of the process wafer. As result, during a subsequent HDP-CVD plasma process to deposit an overlying FSG layer, excessive process wafer surface charging occurs with associated plasma induced damage to semiconductor devices, for example transistors, induced by Fowler-Nordheim tunneling current occurs. For example, it is believed that a charge imbalance initially builds up over the thicker portions of the SRO layer underlying metal lines at the periphery of wafer during the HDP-CVD process. For example conventional process surface charge measurements following deposition of an FSG layer by an HDP-CVD process over a conventionally grown SRO layer by a PECVD process has shown surface charging of about 5.0 Volts.

As a result of the plasma induced charging at a peripheral portion of the wafer process surface, Fowler-Nordheim tunneling current passes from the process surface into the semiconducting substrate through the gate oxide of a peripherally disposed device with current flow toward a center portion of the wafer, subsequently through gate oxides of center disposed devices to return to the process surface to balance the plasma induced charge imbalance. At the center portion of the process wafer, where the Fowler-Nordheim tunneling current passes through the gate oxides of center disposed devices, the gate oxide is more susceptible to damage due the larger Fowler-Nordheim tunneling current at a center portion of the process wafer. As a result, the larger Fowler-Nordheim tunneling current at a center portion of the process wafer produces a greater propensity for damage to the gate oxide/silicon interface where trapping and interface states are altered, resulting in, for example, a shift in gate threshold voltage operating characteristics of a transistor device.

According to one embodiment of the method of the present invention, the SRO layer is formed to have a thickness at a center portion of the wafer thicker compared to a peripheral portion of at least about 10 Angstroms, preferably from about 10 Angstroms to about 100 Angstroms. For example, it has been found that forming the SRO layer in-situ in an HDP-CVD reactor according to preferred embodiments results in less plasma damage during a subsequent HDP-CVD process to form an overlying FSG layer. For example, it has been found that surface charging following the in-situ deposition of the SRO layer according to preferred embodiments followed by an HDP-CVD deposition process to deposit an overlying FSG layer is reduced to about 0.5 Volts, a decrease by an order of magnitude compared to prior art processes. With an SRO layer formed having a relatively thicker dimension over a center portion of the wafer according to preferred embodiments, it is believed that the direction of the Fowler-Nordheim tunneling current is reversed, where advantageously the current passes from a center portion of the wafer to a peripheral portion of the wafer, resulting in a lower Fowler-Nordheim tunneling current passing through the gate oxide layers of peripheral disposed devices, thereby reducing the propensity of plasma damage at the gate oxide/silicon interface.

Figure 1C:
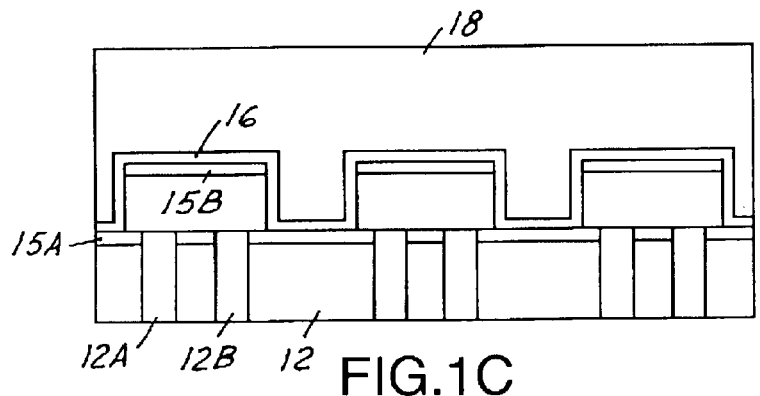

Referring to FIG. 1C, following the formation in-situ of the SRO layer 16 in an HDP-CVD process, an HDP-CVD process (in-situ) is carried out to form an overlying dielectric insulating layer 18, preferably FSG, preferably about 3000 Angstroms to about 8000 Angstroms thick, preferably thick enough to fill the gaps between the metal lines and provide a planarized IMD layer following a subsequent CMP process for forming subsequent vias for inter-level electrical interconnects. Preferably, the concentration of fluorine (F) within the FSG layer 18 is from about 4 to 10 atomic %, more preferably from about 5 to 7 atomic %, most preferably from about 5.5 to about 6.5 atomic %. The HDP-CVD process of the FSG layer is preferably carried out with a plasma gas sources including flows of $SiH_4$, $SiF_4$, $O_2$, and Ar to produce a deposition plasma. Exemplary plasma gas source flow rates are from 10 to 80 sccm $SiH_4$, from 10 to 60 sccm for $SiF_4$, and about 100 to 400 sccm for both $O_2$ and Ar. The deposition pressure is preferably maintained between about 0.5 and 50 milliTorr, more preferably between about 3 and about 12 milliTorr. A plasma RF power is preferably supplied between about 1000 Watts and about 5000 Watts with the wafer process surface temperature preferably maintained at between 325° C. and 475° C. Preferably, the plasma is formed having an ion density of about $1 \times 10^{11}$ per $cm^3$ or greater producing ions with energies of about 20 eV to about 500 eV.

Figure 2B:
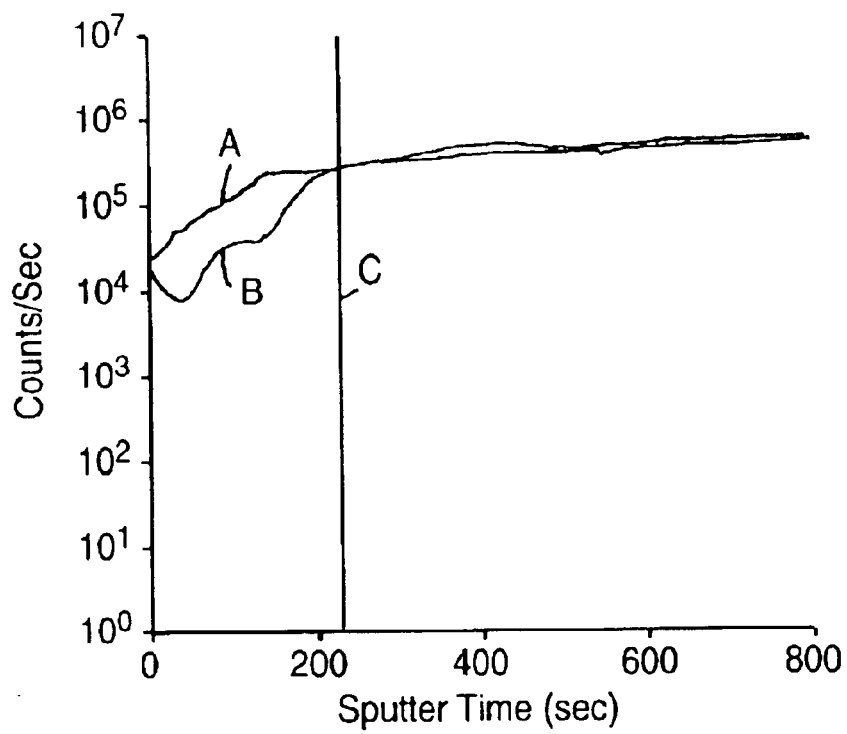
FIG. 2B is a representation of SIMS data showing the improved resistance to fluorine of the SRO layer according to an embodiment of the invention compared to the prior art.

Advantageously, it has been found that producing an SRO layer in-situ according to preferred embodiments to reduce plasma induced damage has the additional benefits of increasing a diffusion resistance to fluorine diffusion. For example referring to FIG. 2 is shown a portion of a Secondary Ion Mass Spectroscopic (SIMS) measurement on a portion of an SRO layer formed according to preferred embodiment and an overlying FSG layer formed according to preferred embodiments compared to a stacked SRO/FSG layers formed according to the prior art where the SRO layer is has been formed by a PECVD process. In FIG. 2 is shown a detected counts/second on the vertical axis of fluorine atoms sputtered from the stacked layer surface and a sputtering time in seconds on the horizontal axis. The sputtering direction is shown through a thickness of the deposited SRO layer to the overlying FSG layer. Line A represents the relative fluorine concentration on sputtering through a plasma enhanced oxide (PEOX) SRO layer formed by a PECVD process according to the prior art followed by an HDP-CVD FSG layer shown to the right of line C representing the SRO/FSG interface. Line B represents the relative fluorine concentration upon sputtering through the thickness of an in-situ HDP-CVD deposited SRO layer formed according to preferred embodiments followed by the HDP-CVD FSG layer to the right of line C. It is seen that the fluorine (F) concentration in the in-situ formed HDP-CVD SRO layer is significantly reduced showing an improved resistance to F diffusion from the FSG layer into the SRO layer.

While the precise reason for the improved F resistance is not known, it is believed that a contributing factor is that the SRO layer formed in-situ by HDP-CVD according to preferred embodiments produces no silicon-nitrogen bonding according to x-ray photoelectron spectroscopy (XPS) or ESCA measurements in contrast to SRO films grown by a conventional PECVD process.

Figure 3:
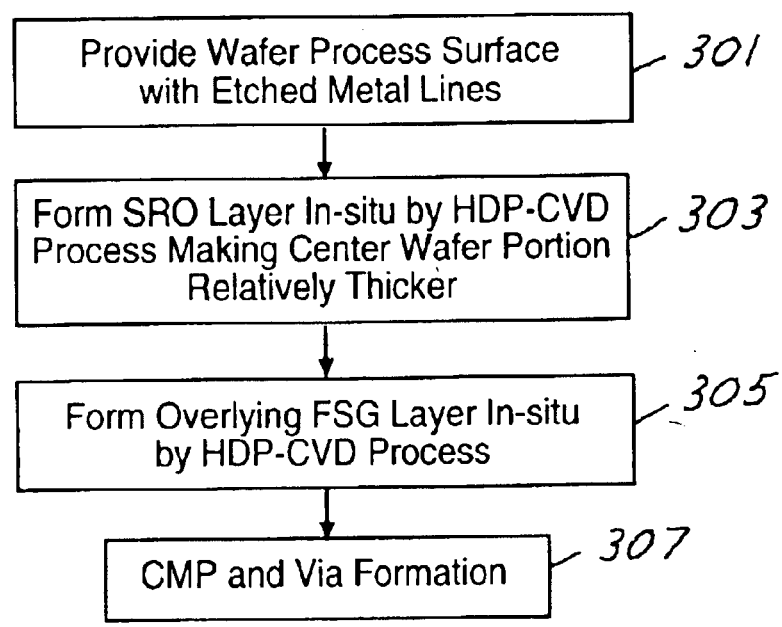
FIG. 3 is a process flow diagram according to several embodiments of the present invention.

Referring to FIG. 3 is a process flow diagram including several embodiments of the present invention. In process 301, a wafer process surface having etched metal lines is provided. In process 303, an SRO layer is formed in-situ in an HDP-CVD plasma deposition process to selectively deposit a relatively thicker dimension at a center portion of the wafer compared to a peripheral portion of the water according to preferred embodiments. In process 305, an overlying fluorine doped oxide, for example FSG is formed over the SRO layer in-situ in a second HDP-CVD plasma deposition process. In process 307, subsequent conventional processes such as chemical mechanical polish (CMP) process and via formation are carried out.

Thus a method has been presented for forming an SRO layer in-situ by an HDP-CVD deposition process having a relatively increased thickness at a central portion of the wafer prior to forming an overlying HDP-CVD FSG layer. Advantages realized by the method of the present invention are reduced plasma induced damage to semiconductor devices including gate oxides and an increased resistance to fluorine atom diffusion into and through the SRO. Consequently, fluorine induced damage to underlying metal lines is reduced or avoided. Other benefits of the method of the present invention include a more economical process cycle resulting in greater wafer throughput by avoiding the necessity of a separate process cycle and process apparatus to carry out a PECVD process to form the SRO layer as well as achieving an improved uniformity in SRO layer thickness uniformity by about 4% to about 6% around radially concentric segments of the process wafer surface as demonstrated by capacitance measurements.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of reducing plasma induced damage in semiconductor devices and fluorine damage to a metal containing layer comprising the steps of:

providing a semiconductor wafer including semiconductor devices comprising a gate oxide and a process surface comprising metal lines;

carrying out a first high density plasma chemical vapor deposition (HDP-CVD) process to controllably produce a silicon rich oxide (SRO) layer comprising a relatively increased thickness at a center portion of the process surface compared to a peripheral portion of the process surface; and, carrying out a second HDP-CVD process in-situ to deposit a fluorine doped silicon dioxide layer over the SRO layer to fill a space between the metal lines.

2. The method of claim 1, wherein the relatively increased thickness is at least about 10 Angstroms sufficient to cause a plasma current induced in the semiconductor wafer during the second HDP-CVD process to flow toward a peripheral portion of the semiconductor wafer.

3. The method of claim 2, wherein the center portion of the process surface comprises from about one-fourth to about one-half the diameter of the semiconductor wafer diameter.

4. The method of claim 1, wherein the gate oxide has a thickness of about 32 Angstroms to about 50 Angstroms.

5. The method of claim 1, wherein the SRO layer is formed by providing plasma source gases comprising silane ($SiH_4$), at least one of $O_2$ and $O_3$, and at least one of $N_2$, $NH_3$, NO, and $N_2O$.

6. The method of claim 5 wherein the SRO layer is produced substantially free of detectable silicon-nitrogen bonds according to ESCA measurements.

7. The method of claim 1, wherein the fluorine doped silicon dioxide layer comprises from about 4 atomic percent to about 10 atomic percent fluorine.

8. The method of claim 7, wherein the fluorine doped silicon dioxide layer comprises from about 5 atomic percent to about 7 atomic percent fluorine.

9. The method of claim 1, wherein the SRO layer is controllably produced by one of increasing a plasma source gas flow rate over a center portion of the process surface and decreasing a plasma source gas flow rate over a peripheral portion of the process surface.

10. The method of claim 1, wherein the SRO layer is formed having a thickness of from about 150 Angstroms to about 500 Angstroms.

11. The method of claim 1, wherein the metal lines are formed from a metal selected from the group consisting of aluminum, aluminum-copper alloys, copper and tungsten.

12. A method of reducing plasma induced damage to semiconductor devices in an HDP-CVD process comprising the steps of:

providing a semiconductor wafer having a process surface comprising metal lines;

carrying out a first high density plasma chemical vapor deposition (HDP-CVD) process to controllably produce a silicon rich oxide (SRO) layer comprising a relatively increased thickness at a center portion of the process surface compared to a peripheral portion of the process surface such that a plasma current induced within the semiconductor wafer during a subsequent second HDP-CVD deposition process flows toward a periphery of the semiconductor wafer; and, carrying out the subsequent second HDP-CVD process in-situ to deposit an fluorosilicate glass (FSG) layer over the SRO layer to fill a space between the metal lines.

13. The method of claim 12, wherein the relatively increased thickness is from about 10 Angstroms to about 100 Angstroms.

14. The method of claim 12, wherein the center portion of the process surface comprises from about one-fourth to about one-half the diameter of the semiconductor wafer diameter.

15. The method of claim 12, wherein the semiconductor process wafer comprises devices having a gate oxide thickness from about 32 Angstroms to about 50 Angstroms.

16. The method of claim 12, wherein the SRO layer is formed by providing plasma source gases comprising silane ($SiH_4$), at least one of $O_2$ and $O_3$, and at least one of $N_2$, $NH_3$, NO, and $N_2O$.

17. The method of claim 5 wherein the SRO layer is produced substantially free of detectable silicon-nitrogen bonds according to ESCA measurements.

18. The method of claim 12, wherein the FSG layer comprises from about 4 atomic percent to about 10 atomic percent fluorine.

19. The method of claim 12, wherein the SRO layer is controllably produced by one of increasing a plasma source gas flow rate over a center portion of the process surface and decreasing a plasma source gas flow rate over a peripheral portion of the process surface.

20. The method of claim 12, wherein the SRO layer is formed having a thickness of from about 150 Angstroms to about 500 Angstroms.

21. The method of claim 12, wherein the metal lines are formed from a metal selected from the group consisting of aluminum, aluminum-copper alloys, copper and tungsten.

* * * * *